United States Patent
Diao et al.

(10) Patent No.: US 7,495,303 B2
(45) Date of Patent: Feb. 24, 2009

(54) MAGNETIC ELEMENTS WITH SPIN ENGINEERED INSERTION LAYERS AND MRAM DEVICES USING THE MAGNETIC ELEMENTS

(75) Inventors: Zhitao Diao, Fremont, CA (US); Yiming Huai, Pleasanton, CA (US); Thierry Valet, Sunnyvale, CA (US); Paul P. Nguyen, San Jose, CA (US); Mahendra Pakala, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 11/699,160

(22) Filed: Jan. 29, 2007

(65) Prior Publication Data

US 2007/0120211 A1 May 31, 2007

Related U.S. Application Data

(63) Continuation of application No. 10/938,219, filed on Sep. 9, 2004, now Pat. No. 7,369,427.

(51) Int. Cl.
*G11C 11/00* (2006.01)
*G11C 11/14* (2006.01)
*G11C 11/15* (2006.01)
*H01L 27/22* (2006.01)

(52) U.S. Cl. .......... 257/421; 257/427; 365/158; 365/171; 365/173

(58) Field of Classification Search .......... 365/158, 365/171, 173; 257/421, 427
See application file for complete search history.

(56) References Cited

U.S. PATENT DOCUMENTS

| 6,714,444 | B2 | 3/2004 | Huai et al. |
|---|---|---|---|
| 6,829,161 | B2 | 12/2004 | Huai et al. |
| 6,906,949 | B1 | 6/2005 | Nakamura et al. |
| 6,953,601 | B2 | 10/2005 | Li et al. |
| 2003/0007398 | A1 | 1/2003 | Daughton et al. |
| 2003/0179510 | A1* | 9/2003 | Hayakawa ............ 360/324.1 |
| 2004/0136231 | A1* | 7/2004 | Huai et al. ............... 365/158 |

OTHER PUBLICATIONS

J.C. Slonczewski, Current-driven excitation of magnetic multilayers, Journal of Magnetism and Magnetic Materials, vol. 159, pp. L1-L7 (1996).
L. Berger, Emission of spin waves by a magnetic multilayer traversed by a current, The American Physical Society, Physical review B, vol. 54, No. 13, pp. 9353-9358 (Oct. 1, 1996).
F.J. Albert, et al., Spin-polarized current switching of a Co thin film nanomagnet, American Institute of Physics, Applied Physics Letters, vol. 77, No. 23, pp. 3809-3811 (Dec. 4, 2000).
Y. Jiang, et al., Substantial reduction of critical current for magnetization switching in an exchange-biased spin valve, Published online: May 9, 2004; doi:10.1038/nmat1120.
Y. Jiang, et al., Effective Reduction of Critical Current for Current-Induced Magnetization Switching by a Ru Layer Insertion in an Exchange-Biased Spin Valve, The American Physical Society, Physical Review Letters, vol. 92, No. 16, pp. 1-4 (Apr. 23, 2004).

* cited by examiner

*Primary Examiner*—Richard Elms
*Assistant Examiner*—Allison P Bernstein
(74) *Attorney, Agent, or Firm*—Strategic Patent Group, P.C.

(57) ABSTRACT

A method and system include providing a single pinned layer, a free layer, and a spacer layer between the pinned and free layers. The spacer layer is nonmagnetic. The magnetic element is configured to allow the free layer to be switched due to spin transfer when a write current is passed through the magnetic element. The free layer is a simple free layer. In one aspect, the method and system include providing a spin engineered layer adjacent to the free layer. The spin engineered layer is configured to more strongly scatter majority electrons than minority electrons. In another aspect, at least one of the pinned, free, and spacer layers is a spin engineered layer having an internal spin engineered layer configured to more strongly scatter majority electrons than minority electrons. In this aspect, the magnetic element may include another pinned layer and a barrier layer between the free and pinned layers.

1 Claim, 7 Drawing Sheets

340''

340'''

340''''

MAGNETIC ELEMENTS WITH SPIN ENGINEERED INSERTION LAYERS AND MRAM DEVICES USING THE MAGNETIC ELEMENTS

CROSS-REFERENCE TO RELATED APPLICATIONS

The present application is a continuation of U.S. patent application Ser. No. 10/938,219 entitled "MAGNETIC ELEMENTS WITH SPIN ENGINEERED INSERTION LAYERS AND MRAM DEVICES USING THE MAGNETIC ELEMENTS" filed on Sep. 9, 2004, now U.S. Pat. No. 7,369,427, and assigned to the assignee of the present application.

FIELD OF THE INVENTION

The present invention relates to magnetic memory systems, and more particularly to a method and system for providing a magnetic element that employs a spin transfer effect in switching, that can be switched at a reduced current and that is suitable for use in a magnetic memory such as magnetic random access memory ("MRAM").

BACKGROUND OF THE INVENTION

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. However, the conventional barrier layer 16' is an insulator that is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B).

Spin transfer is an effect that may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. Electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$-$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, generally less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

Spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer can be used in switching the magnetization 19/19' of the conventional free layer 18/18', one of ordinary skill in the art will readily recognize that a high current density is typically required. As discussed above, a current density of greater than approximately $10^7$ A/cm$^2$ is typically required. One of ordinary skill in the art will also readily recognize that such a high current density implies that a high write current and a small magnetic element size are necessary. Both of these features adversely affect the utility and reliability of such conventional magnetic elements 10/10' in a magnetic memory. A write current of greater than two milliamps and magnetic element dimensions on the order of 0.1 micrometer by 0.2 micrometer are implied by the high current density. For high density MRAM applications, a magnetic element is typically coupled to an isolation transistor (not shown) in order to form a memory cell. For such a conventional MRAM low power consumption and small isolation transistor dimensions are desirable. The high write current generally required would increase the power consumption of conventional spin transfer based MRAMs. In addition, the lateral dimensions of the isolation transistor are proportional to the saturation current of the isolation transistor. For spin transfer, the required saturation current corresponds to the write current. Thus, for a conventional spin transfer based MRAM, the isolation transistor would be large. In addition, the conventional magnetic element 10', which has a higher resistance and thus a higher signal, may be less reliable because the conventional barrier layer 16' may be subject to dielectric breakdown at higher write currents. Thus, the conventional magnetic elements 10/10' may be unsuitable for use in higher density conventional MRAMs using spin transfer to write to the conventional magnetic elements 10/10'.

Accordingly, what is needed is a system and method for providing a magnetic memory element that can be switched using spin transfer at a lower write current. The present invention addresses such a need.

BRIEF SUMMARY OF THE INVENTION

The present invention provides a method and system for providing a magnetic element. The method and system include providing a pinned layer, a free layer, and a spacer layer between the pinned and free layers. The spacer layer is nonmagnetic. The magnetic element is configured to allow the free layer to be switched due to spin transfer when a write current is passed through the magnetic element. In one aspect, the method and system include providing a spin engineered layer adjacent to the free layer. The spin engineered layer is configured to more strongly scatter majority electrons than minority electrons. In another aspect, at least one of the pinned, free, and spacer layers is a spin engineered layer having an internal spin engineered layer configured to more strongly scatter majority electrons than minority electrons. In this aspect, the magnetic element may include another pinned layer and a barrier layer between the free and other pinned layers.

According to the method and system disclosed herein, the present invention provides a magnetic element that can be written using spin transfer at a lower write current, thereby reducing power consumption, cell size in an MRAM, and improving reliability.

DETAILED DESCRIPTION OF THE INVENTION

Figure 1A:
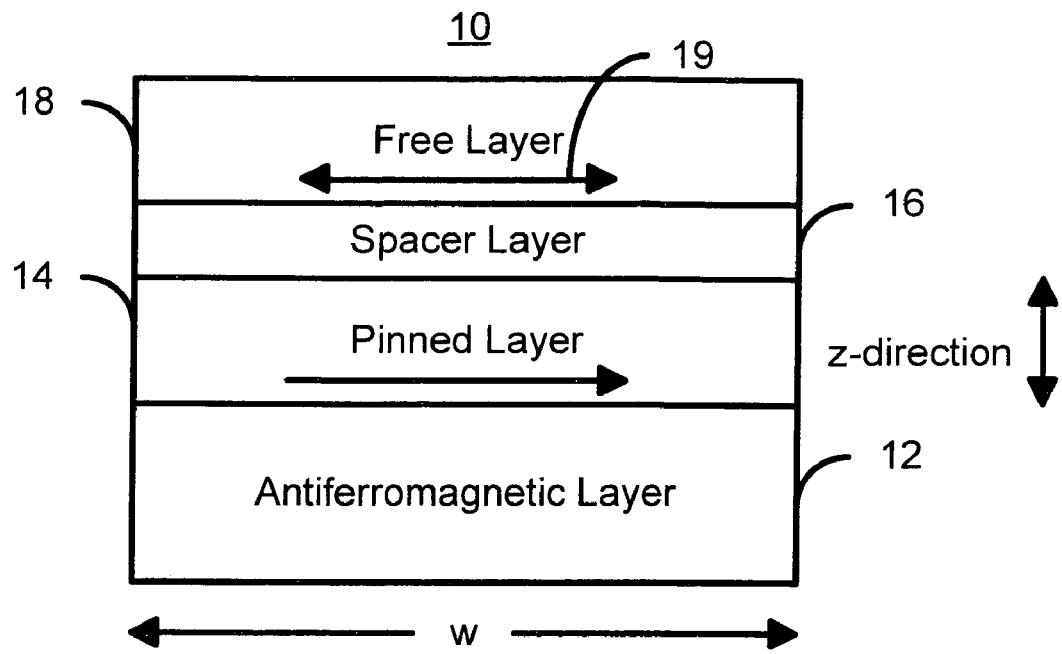
FIG. 1A is a diagram of a conventional magnetic element, a spin valve.
Figure 1B:
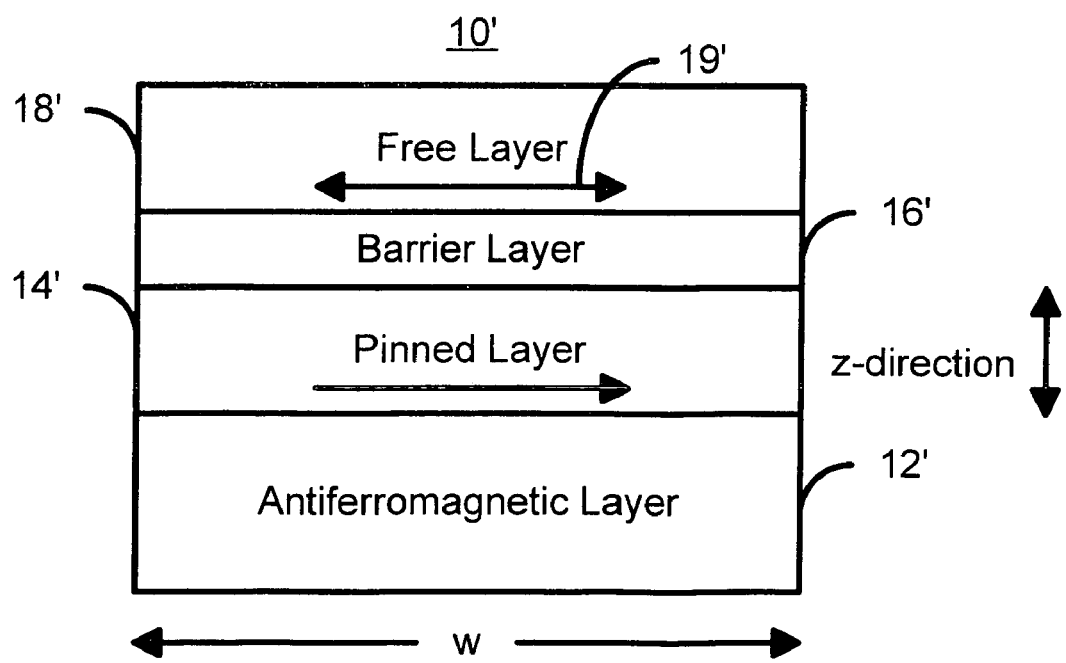
FIG. 1B is a diagram of another conventional magnetic element, a spin tunneling junction

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing a magnetic element. The method and system include providing a pinned layer, a free layer, and a spacer layer between the pinned and free layers. The spacer layer is nonmagnetic. The magnetic element is configured to allow the free layer to be switched due to spin transfer when a write current is passed through the magnetic element. In one aspect, the method and system include providing a spin engineered layer adjacent to the free layer. The spin engineered layer is configured to more strongly scatter majority electrons than minority electrons. In another aspect, at least one of the pinned, free, and spacer layers is a spin engineered layer having an internal spin engineered layer configured to more strongly scatter majority electrons than minority electrons. In this aspect, the magnetic element may include another pinned layer and a barrier layer between the free and other pinned layers.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 2:
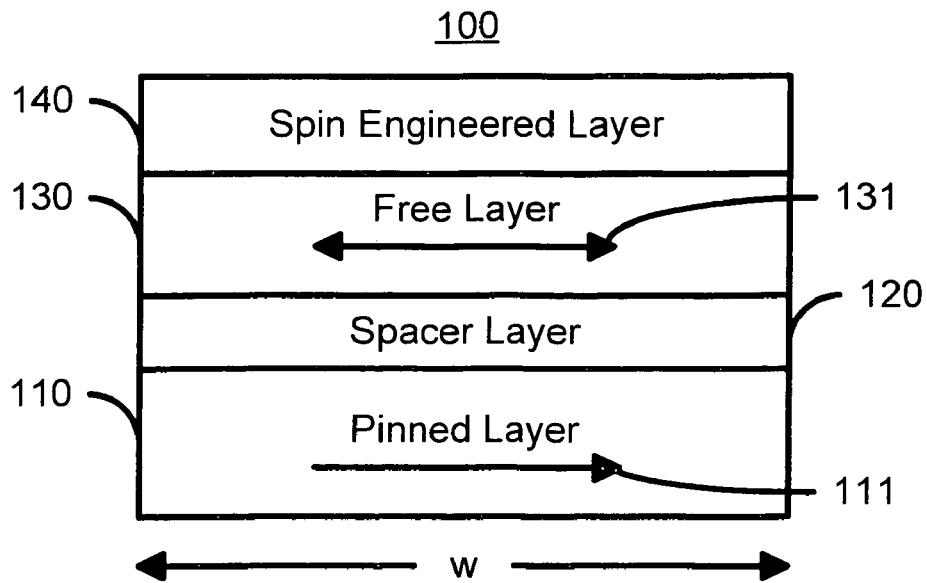
FIG. 2 depicts one embodiment of a portion of a magnetic element in accordance with the present invention utilizing spin engineering.

To more particularly illustrate the method and system in accordance with the present invention, refer now to FIG. 2, depicting one embodiment of a portion of the magnetic element 100 in accordance with the present invention utilizing spin current induced switching and spin engineering. The magnetic element 100 is preferably used in a magnetic memory, such as a MRAM. Thus, the magnetic element 100 may be used in a memory cell including an isolation transistor (not shown), as well as other configurations of magnetic memories. Moreover, the magnetic element 100 preferably utilizes two terminals (not shown) near the top and bottom of the magnetic element. The magnetic element 100 includes a pinned layer 110, a spacer layer 120, a free layer 130, and a spin engineered layer 140. The magnetic element 100 generally also includes a pinning layer (not shown) used to pin the magnetization 111 of the pinned layer 110, as well as seed layers (not shown) and capping layers (not shown). The pinning layer is typically an AFM layer such as PtMn or IrMn. Furthermore, the magnetic element 100 is configured such that the free layer 130 can be written using spin transfer. In a preferred embodiment, the lateral dimensions, such as the width w, of the free layer 130 are thus small and preferably less than two hundred nanometers. In addition, some difference is preferably provided between the lateral dimensions to ensure that the free layer 130 has a particular easy axis.

The free layer 130 is ferromagnetic and preferably includes at least one of elements Co, Fe or Ni. The free layer 130 also preferably has a positive bulk spin anisotropy and, therefore, a positive bulk spin asymmetry coefficient. A positive spin anisotropy corresponds to minority electrons being scattered more strongly than majority electrons. The free layer 130 may be a simple free layer, for example containing a single material or an alloy of multiple materials. In one embodiment, the free layer 130 includes CoFeY, where Y is between five and fifty atomic percent of at least one of B, Ta, Hf, and Zr. In addition, the free layer 130 has a thickness of between five and fifty Angstroms. In an alternate embodiment, the free layer 130 may have another structure. Moreover, with appropriate processing, the saturation magnetization of the free layer 130 might be varied between four hundred and one thousand four hundred emu per cubic centimeters, for example by varying the composition of certain elements.

The pinned layer 110 is also ferromagnetic. The pinned layer 110 also preferably has a positive bulk spin anisotropy and therefore, a positive bulk spin asymmetry coefficient. For example, the pinned layer 110 might include at least one of the following: Co, Ni, Fe, or their alloys; CoFeY, where Y is between 5 and fifty atomic percent of at least one of B, Ta, Hf, and Zr. In one embodiment, the pinned layer 110 includes ferromagnetic layers that are ferromagnetically coupled. For example, the pinned layer 110 might be a bilayer of CoFeX and a ferromagnetic layer, where X is at least one of Ru, Os, Ir, Rh, Re, Mn, Cr, and V. Similarly, the pinned layer might include two ferromagnetic layers separated by a layer of Ru, RuX, and/or CoFeX, where X is at least one of Ru, Os, Ir, Rh, Re, Mn, Cr, and V. In such an embodiment, the two ferromagnetic layers would be ferromagnetically coupled. The pinned layer 110 might also be a synthetic pinned layer containing two ferromagnetic layers separated by a layer of Ru, RuX, or CoFeX, where X includes at least one of Ru, Os, Ir, Rh, Re, Mn, Cr, and V. In such an embodiment, an AFM layer (not shown) is preferably used as a pinning layer to pin the magnetization 111 of the pinned layer 110. Similarly, where such an AFM layer is used, the pinned layer might also include a bilayer of CoFeX and a ferromagnetic layer, where X includes at least one of Ru, Os, Ir, Rh, Re, Mn, Cr, and V. In such an embodiment, the AFM layer might include alloys such as PtMn or IrMn.

The spacer layer 120 is nonmagnetic. The spacer layer 120 is preferably an insulating barrier layer, for example composed of alumina. In such an embodiment, the signal from the magnetic element 100 is higher because of the higher resistance of the barrier layer 120. In such an embodiment, the barrier layer 120 is preferably less than two nanometers thick such that charge carriers can tunnel between the free layer 130 and the pinned layer 110. In an alternate embodiment, the spacer layer 120 might be conductive. However, such an embodiment would have a lower resistance difference between the two different magnetization directions of the free layer 130 and, therefore, a lower signal.

The spin engineered layer 140 allows the free layer 130 to be written due to spin transfer at a lower write current. The spin engineered layer 140 is configured to more strongly scatter majority electrons than minority electrons, at least at the interfaces of the spin engineered layer 140, such as the interface with the free layer 130. Thus, in a preferred embodiment, the spin engineered layer 140 is configured to have at least a negative interface spin asymmetric coefficient. This stronger scattering of majority electrons aids in reducing the write current for spin transfer, as described below. The spin engineered layer 140 preferably includes at least one of the 3d, 4d, or 5d transition metals or their alloys. Thus, the spin engineered layer includes at least one of Ru, Os, Ir, Re, Mn, Cr, Mo, and W. Similarly, alloys such as RuX, where X is Os, Ir, Re, Mn, Cr, Mo, and W might be used. In such an embodiment, a negative interface spin asymmetry coefficient is provided. In an alternate embodiment, the spin engineered layer 140 includes CoFe alloyed with at least one of the 3d, 4d, or 5d transition metals. For example, CoFeX, where X includes at least one of Ru, Os, Ir, Rh, Re, Mn, Cr, and V might be used. In such an embodiment, the spin engineered layer 140 is preferably between approximately five and one hundred Angstroms thick. In such an embodiment, both a negative bulk spin asymmetry coefficient and a negative interface spin asymmetry coefficient are provided. In such an embodiment, both the negative interface spin asymmetry coefficient and the negative bulk spin asymmetry coefficient contribute to a lowering of the write current required to switch the magnetization 131 of the free layer 130 using spin transfer.

During writing, the magnetization 131 of the free layer 130 may be switched at a lower current. If the magnetization 131 of the free layer 130 is desired to be aligned parallel with the magnetization 111 of the pinned layer 110, a write current is driven downward as seen in FIG. 2. In such a case, the electrons travel upward as seen in FIG. 2. The pinned layer 110 is thick enough such that majority electrons have their spins aligned with the magnetization 111 of the pinned layer 110. Due to spin transfer, majority electrons from the pinned layer 110 tend to transfer their angular momentum to the free layer 130, tending to cause the magnetization 131 of the free layer 130 to be aligned parallel to the magnetization 111 of the pinned layer 110. Furthermore, the spin engineered layer 140 more strongly scatters majority electrons exiting the free layer 130, at or near the interface of the free layer 130 and the spin engineered layer 140. These majority electrons still have their spins substantially parallel to the magnetization 111 of the pinned layer 110. Consequently, these majority electrons are scattered back to the free layer 130, and have an additional opportunity to transfer their angular momentum to the free layer 130. As a result, the spin transfer becomes more efficient. Consequently, a lower current is required to switch the magnetization 131 of the free layer 130.

If the magnetization 131 of the free layer 130 is desired to be switched to be antiparallel to the magnetization 111 of the pinned layer 110, then the write current is driven upwards as seen in FIG. 2. A write current flowing upward corresponds to electrons moving downward. For such a write current, the majority electrons are scattered more strongly by the spin engineered layer 140. Thus, majority electrons tend not to be transmitted through the spin engineered layer 140 to the free layer 130. Minority electrons, in contrast, pass through the free layer 130 and are scattered off of the pinned layer 110. The (reduced) number of majority electrons that pass through the free layer 130 tend not to be scattered by the pinned layer 110, while minority electrons can be strongly scattered by the pinned layer 110 and then return to the free layer 130 and transfer their angular momentum to the free layer 130. This transfer of angular momentum by the minority electrons tends to align the magnetization 131 of the free layer 130 antiparallel to the magnetization 111 of the pinned layer 110. Because the majority electrons are more strongly scattered by the spin engineered layer 140 but only weakly scattered back by the pinned layer, the majority electrons are less likely to transfer their angular momentum to the free layer 130. Consequently, the transfer of angular momentum in the desired (minority) direction is enhanced. Again, the write current required to write to the free layer 130 is reduced. Thus, the write current required to align the magnetization 131 of the free layer 130 either parallel or antiparallel to that of the pinned layer 110 is reduced.

During reading, a read current is driven through the magnetic element 100 in the CPP configuration. The read current is preferably significantly less than the write current, for example by a factor of two or more. As a result, the read current is not sufficient to induce a spin transfer based switching of the magnetization 131 of the free layer 130.

The ability of the spin engineered layer 140 to reduce the switching current density can also be understood using the prevalent spin transfer spin-torque model described by J. C. Slonczewski in, "Current-driven Excitation of Magnetic Multilayers," *Journal of Magnetism and Magnetic Materials*, vol. 159, p. L1-L5 (1996). According to Slonczewski's model, the switching current density $J_c$ for the free layer of a spin transfer stack is proportional to:

$$J_c \propto \alpha M_s t (H_{eff} + 2\pi M_s)/g$$

where $\alpha$ is the phenomenological Gilbert damping constant, t is the thickness of the free layer and $M_s$ is the saturation magnetization of the free layer. In addition, $H_{eff}$ includes anisotropy field ($H_{an}$), exchange ($H_{ex}$) and applied field ($H_{ap}$) aligned along the easy axis of free layer in the film plane. The $4\pi M$ term corresponds to the out-of-plane demagnetizing field, acting perpendicular to the free layer plane. Finally, g reflects the spin-transfer efficiency and is related to the spin polarization. This critical switching current density corresponds to the minimum write current that can be used. Thus, if the critical switching current density is reduced, the write current density and thus the write current can be reduced. As can be determined from the relationship above, a decrease in the saturation magnetization of the free layer, a decrease in the thickness of the free layer, or an increase in the spin polarization (and thus an increase in g) can decrease the critical current density and, therefore, the write current.

The spin engineered layer 140 effectively increases the spin polarization and, therefore, increases g. Because the spin engineered layer 140 more strongly scatters majority electrons, at least at the interface with the free layer 130, the net result is to effectively increase the fraction of majority electrons when switching the magnetization 131 to be parallel to the magnetization 111 of the pinned layer 110 and to increase the fraction of minority electrons when switching the magnetization 131 to be antiparallel to the magnetization 111 of the pinned layer 110. As a result, the spin polarization in the desired direction can be considered to increase. Thus, g increases and the critical switching current density decreases.

Because the presence of the spin engineered layer 140 enhances spin transfer, the write current required to write to the magnetic element 100 is reduced. Consequently, the magnetic element 100 would dissipate less power. In addition, any isolation transistor (not shown) used with the magnetic element 100 could have smaller lateral dimensions. Furthermore, the reduction in the write current is obtained without requiring a reduction in $M_s$ or the thickness of the free layer 130. Consequently, the susceptibility of the magnetic element to thermal fluctuations that can be inherent in reducing $M_s$ and/or the thickness of the free layer 130 may be avoided. Reliability of the magnetic element 100 is thus improved. Moreover, because spin transfer is used as a mechanism for writing to the magnetic element 100, many of the drawbacks of writing to magnetic elements using an external field are avoided. The magnetic element 100 may also be fabricated using conventional equipment, particularly physical vapor deposition such as magnetron sputtering. The magnetic element 100, therefore, may be manufactured without radically changing the fabrication systems and conditions currently used. As a result, the magnetic element 100 may be used for higher density MRAM.

Figure 3:
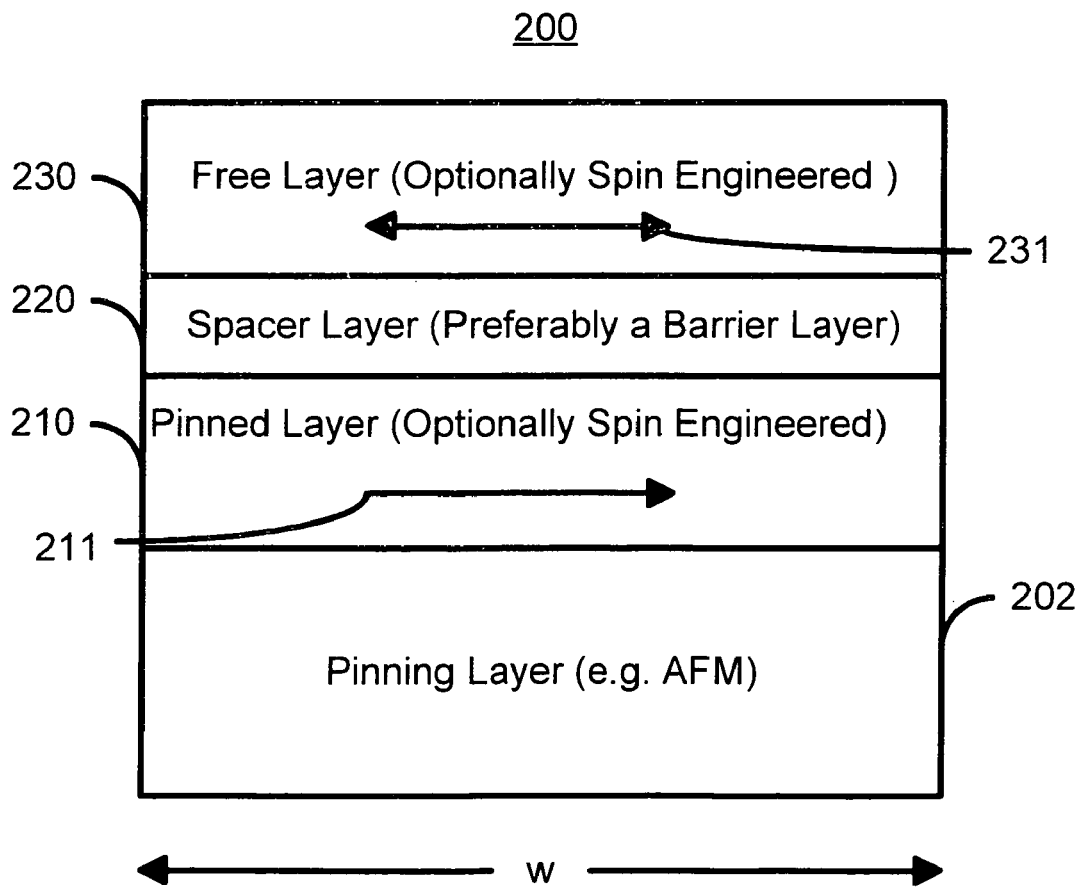
FIG. 3 is one preferred embodiment of a magnetic element in accordance with the present invention utilizing spin engineering.

FIG. 3 depicts a preferred embodiment of a magnetic element 200 in accordance with the present invention utilizing spin engineering. Portions of the magnetic element 200 are analogous to portions of the magnetic element 100 and are, therefore, labeled similarly. Consequently, the magnetic element 200 includes a pinned layer 210, a spacer layer 220, and a free layer 230. However, no spin engineered layer 140 is depicted. This is because at least one of the pinned layer 210, the spacer layer 220 and the free layer 230 is spin engineered. In a preferred embodiment, at least the free layer 230 includes an internal spin engineered layer. Preferably, both the pinned layer 210 and the free layer 230 are spin engineered. In a preferred embodiment, the spacer layer 220 would only be spin engineered if additional layers, such as an additional spacer layer (not shown in FIG. 3) and an additional pinned layer (not shown in FIG. 3), were provided. Also in a preferred embodiment, the spacer layer is a barrier layer 220 that is insulating but sufficiently thin that electrons can tunnel between the pinned layer 210 and the free layer 230. The magnetic element 200 also includes a pinning layer 202 that is used to pin the magnetization 211 of the pinned layer 210 in the desired direction. In addition, the magnetic element 200 generally also includes seed layers (not shown) and capping layers (not shown). Furthermore, the magnetic element 200 is configured such that the free layer 230 can be written using spin transfer. In a preferred embodiment, the lateral dimensions, such as the width w, of the free layer 230 are thus small and preferably less than two hundred nanometers. In addition, some difference is preferably provided between the lateral dimensions to ensure that the free layer 230 has a particular easy axis of magnetization. Thus, the lateral dimensions of the free layer 230 are preferably substantially the same as discussed above for the free layer 230.

Figure 4:
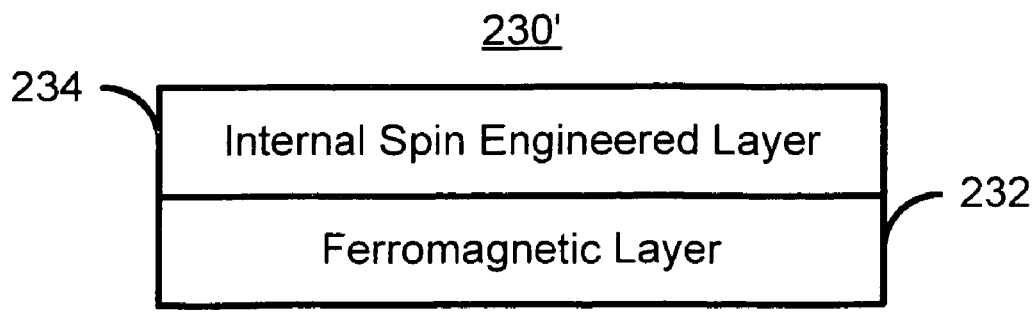
FIG. 4 depicts a first embodiment of a spin engineered free layer in accordance with the present invention.
Figure 5:
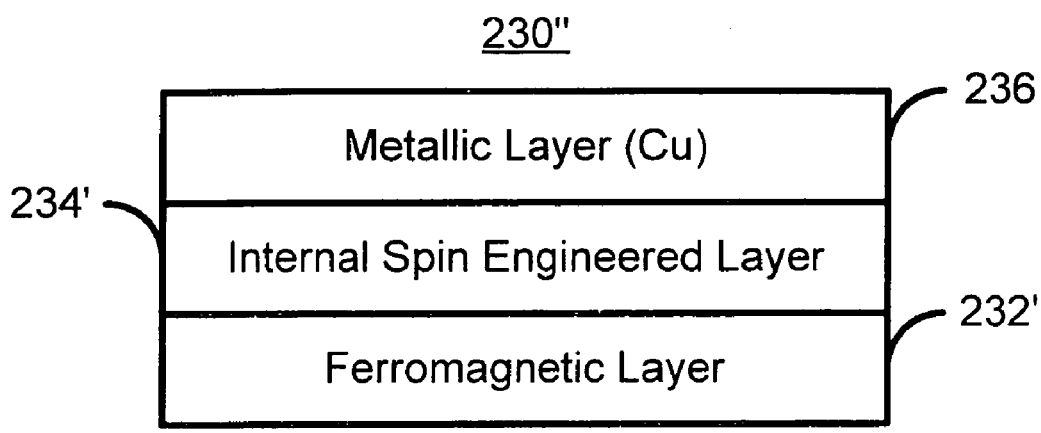
FIG. 5 depicts a second embodiment of a spin engineered free layer in accordance with the present invention.
Figure 6:
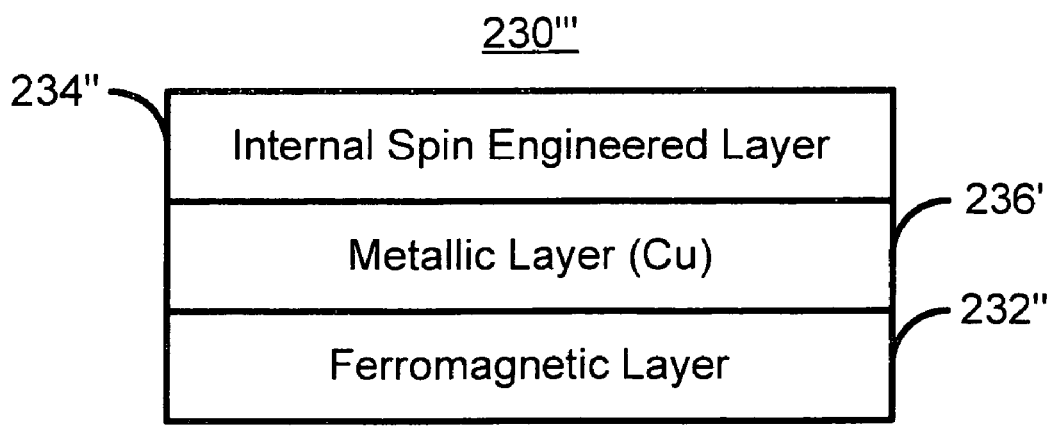
FIG. 6 depicts a third embodiment of a spin engineered free layer in accordance with the present invention.

The free layer 230 and/or the pinned layer 210 are preferably spin engineered. If the free layer 230 is not spin engineered, then the free layer is preferably substantially as described above for the free layer 130 depicted in FIG. 2. FIGS. 4, 5, and 6 depict embodiments of a spin engineered free layer 230. Referring to FIGS. 3-6, if the free layer 230 is spin engineered, then the free layer 230 includes at least one internal spin engineered layer. Thus, a first embodiment of a spin engineered free layer 230' in accordance with the present invention is depicted in FIG. 4. The free layer 230' includes a ferromagnetic layer 232 and an internal spin engineered layer 234. The ferromagnetic layer 232 resides between the spacer layer 220 and the internal spin engineered layer 234. The ferromagnetic layer 232 may be substantially the same as the free layer 130 depicted in FIG. 2. Referring back to FIGS. 3-9, note that when the magnetic element 200 employs the free layer 230' and does not spin engineer the pinned layer 210, the magnetic element 200 could be considered substantially the same as the magnetic element 100 depicted in FIG. 2. Referring to FIGS. 3-6, a second embodiment of a spin engineered free layer 230" in accordance with the present invention is depicted in FIG. 5. The spin engineered free layer 230" includes a ferromagnetic layer 232', an internal spin engineered layer 234', and a metallic layer 236 that is preferably Cu. The ferromagnetic layer 232' resides between the spacer layer 220 and the internal spin engineered layer 234'. The ferromagnetic layer 232' may be substantially the same as the free layer 130 depicted in FIG. 2. Referring back to FIGS. 3-9, the internal spin engineered layer 234' resides between the Cu layer 236 and the ferromagnetic layer 232'. FIG. 6 depicts a third embodiment of a spin engineered free layer 230''' in accordance with the present invention. The spin engineered free layer 230''' includes a ferromagnetic layer 232'', a metallic layer 236' that is preferably Cu, and an internal spin engineered layer 234'' that are ferromagnetic. The ferromagnetic layer 232'' resides between the spacer layer 220 and the Cu layer 236'. The ferromagnetic layer 232'' may be substantially the same as the free layer 130 depicted in FIG. 2. Referring back to FIGS. 3-9, the Cu layer 236' resides between the internal spin engineered layer 234'' and the ferromagnetic layer 232''.

The internal spin engineered layer 234, 234', and/or 234'' are configured to more strongly scatter majority electrons than minority electrons, preferably at least at the interfaces of the internal spin engineered layer 234, 234', and/or 234'', respectively. Thus, the internal spin engineered layer 234, 234', and/or 234'' preferably has at least a negative interface spin asymmetry coefficient. The internal spin engineered layer 234, 234', and/or 234'' may have the same structure as the spin engineered layer 140 depicted in FIG. 2, where the internal spin engineered layer 234'' is ferromagnetic. Referring back to FIGS. 3-6, the internal spin engineered layer 234 and 234' thus preferably includes Ru or Co(Fe)Ru, while the internal spin engineered layer 234'' preferably includes Co (Fe)Ru. Where Ru is used, the internal spin engineered layer 234, 234', and/or 234'' has a negative interface spin asymmetry coefficient. Where CoFeRu is used, the internal spin engineered layer 234, 234', and/or 234'' both a negative interface spin asymmetry coefficient and a negative bulk spin asymmetry coefficient. Thus, again at least the interface of the ferromagnetic layer 232, 232' and the Cu layer 236' and the internal spin engineered layer 234, 234', and/or 234'', respectively, majority electrons are more strongly scattered than minority electrons.

The internal spin engineered layers 234, 234', and/or 234'' function in an analogous manner to the spin engineered layer 140 depicted in FIG. 2. Referring back to FIGS. 3-6, when current is driven downwards (electrons traveling upwards) in FIGS. 3-6, the internal spin engineered layers 234, 234' and/or 234'' tend to reflection majority electrons back to the ferromagnetic layer 232, 232', and/or 232'', respectively. As a result, spin transfer is enhanced. When current is driven upwards (electrons traveling downwards), majority electrons are more strongly scattered by the internal spin engineered layers 234, 234' and/or 234''. Consequently, minority electrons are more likely to pass through the ferromagnetic layers 232, 232', and 232'', reflect from the pinned layer 210, and transfer their angular momentum to the free layer 230', 230'', and 230''', respectively. Consequently, spin transfer is enhanced in both cases and the write current used can be reduced.

Figure 7:
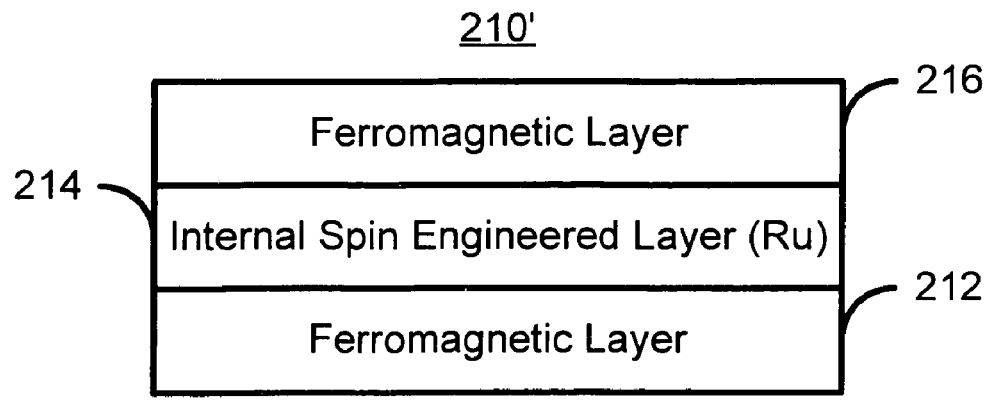
FIG. 7 depicts a first embodiment of a spin engineered pinned layer in accordance with the present invention.
Figure 8:
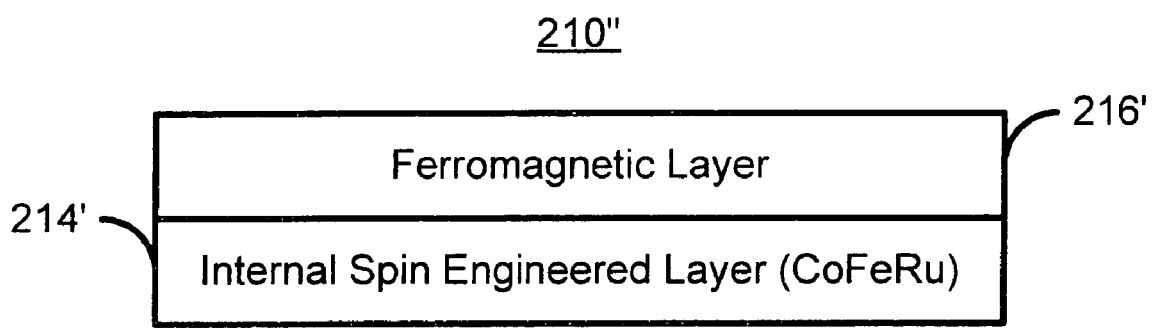
FIG. 8 depicts a second embodiment of a spin engineered pinned layer in accordance with the present invention.
Figure 9:
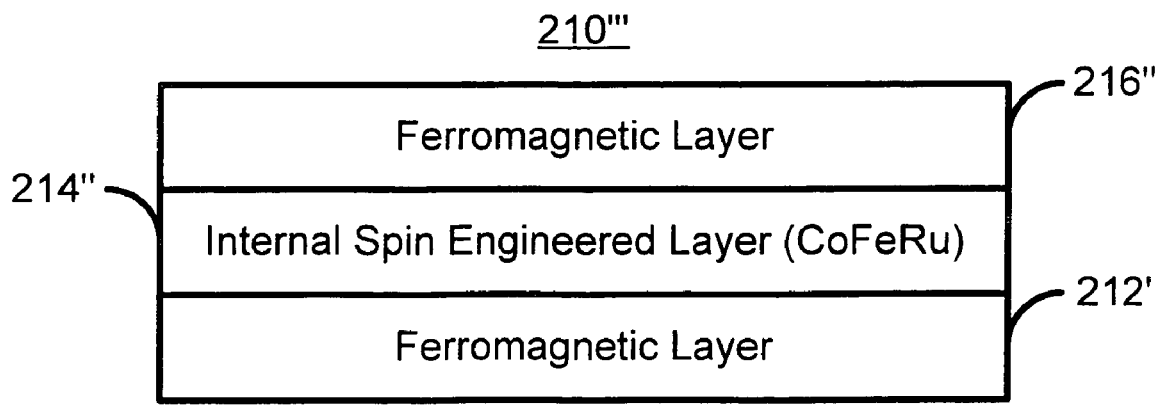
FIG. 9 depicts a third embodiment of a spin engineered pinned layer in accordance with the present invention.

If the pinned layer 210 is not spin engineered, then the pinned layer 210 is preferably substantially as described above for the pinned layer 110 depicted in FIG. 2. Referring back to FIGS. 3-9, if the pinned layer 210 is spin engineered, then the pinned layer 210 includes at least one internal spin engineered layer. FIGS. 7, 8, and 9 depict embodiments of the spin engineered pinned layer 210. Referring to FIGS. 3-9, if the pinned layer 210 is spin engineered, then the pinned layer 210 includes at least one internal spin engineered layer. Thus, a first embodiment of a spin engineered layer 210' in accordance with the present invention is depicted in FIG. 7. The pinned layer 210' includes a first ferromagnetic layer 212, an internal spin engineered layer 214 that is preferably Ru, and a second ferromagnetic layer 216. The ferromagnetic layer 216 resides between the spacer layer 220 and the internal spin engineered layer 214. The ferromagnetic layers 212 and 216 may each be substantially the same as the pinned layer 110 depicted in FIG. 2. Referring back to FIGS. 3-9, the pinned layer 210' is also configured such that the ferromagnetic layers 212 and 216 are ferromagnetically coupled. Consequently, the ferromagnetic layers 212 and 216 will have their magnetizations aligned. A second embodiment of a spin engineered pinned layer 210" in accordance with the present invention is depicted in FIG. 8. The spin engineered pinned layer 210" includes an internal spin engineered layer 214" and a ferromagnetic layer 216'. The ferromagnetic layer 216' resides between the spacer layer 220 and the internal spin engineered layer 214'. The ferromagnetic layer 216' might be substantially the same as the pinned layer 110 depicted in FIG. 2. Referring back to FIGS. 3-9, the internal spin engineered layer 214' is preferably composed of Co(Fe)Ru. In one embodiment, a bilayer of Co(Fe)Ru and a ferromagnet repeated n times might be used. FIG. 9 depicts a third embodiment of a spin engineered pinned layer 210''' in accordance with the present invention. The spin engineered pinned layer 210''' includes a first ferromagnetic layer 212', an internal spin engineered layer 214'', and a second ferromagnetic layer 216''. The ferromagnetic layer 216'' resides between the spacer layer 220 and the internal spin engineered layer 214''. The ferromagnetic layers 212' and 216'' may each be substantially the same as the pinned layer 110 depicted in FIG. 2 and are ferromagnetically coupled. Referring back to FIGS. 3-9, the internal spin engineered layer 214'' is preferably Co(Fe)Ru. In an alternate embodiment, a bilayer of Co/Ru repeated n times might be used.

Thus, the internal spin engineered layers 214, 214', and/or 214'' are configured to more strongly scatter majority electrons than minority electrons at least at the interface with the ferromagnetic layers 212, 216, 216', 212', and 216''. As a result, majority electrons are more likely to be reflected back to the free layer 230, 230', 230'', and/or 230'''. Consequently, spin transfer is enhanced for switching the magnetization 231, 231', 231'', and/or 231''' of the free layer 230, 230', 230'', and/or 230''' to either direction.

Because the use of the free layer 230, 230', 230'', and/or 230''' and the pinned layer 210, 210', 210'', and/or 210''', spin transfer is enhanced and the write current required to write to the magnetic element 200 is reduced. Consequently, the magnetic element 200 would dissipate less power. In addition, any isolation transistor (not shown) used with the magnetic element 200 could have smaller lateral dimensions. Furthermore, the reduction in the write current is obtained without requiring a reduction in $M_s$ or the thickness of the free layer 230. Consequently, the susceptibility of the magnetic element to thermal fluctuations that can be inherent in reducing $M_s$ and/or the thickness of the free layer 230 may be avoided. Reliability of the magnetic element 200 is thus improved. Moreover, because spin transfer is used as a mechanism for writing to the magnetic element 200, a many of the drawbacks of writing to magnetic elements using an external field are avoided. The magnetic element 200 may also be fabricated using conventional equipment, particularly physical vapor deposition such as magnetron sputtering. The magnetic element 200, therefore, may be manufactured without radically changing the fabrication systems and conditions currently used. As a result, the magnetic element 200 may be used for higher density MRAM.

Figure 10:
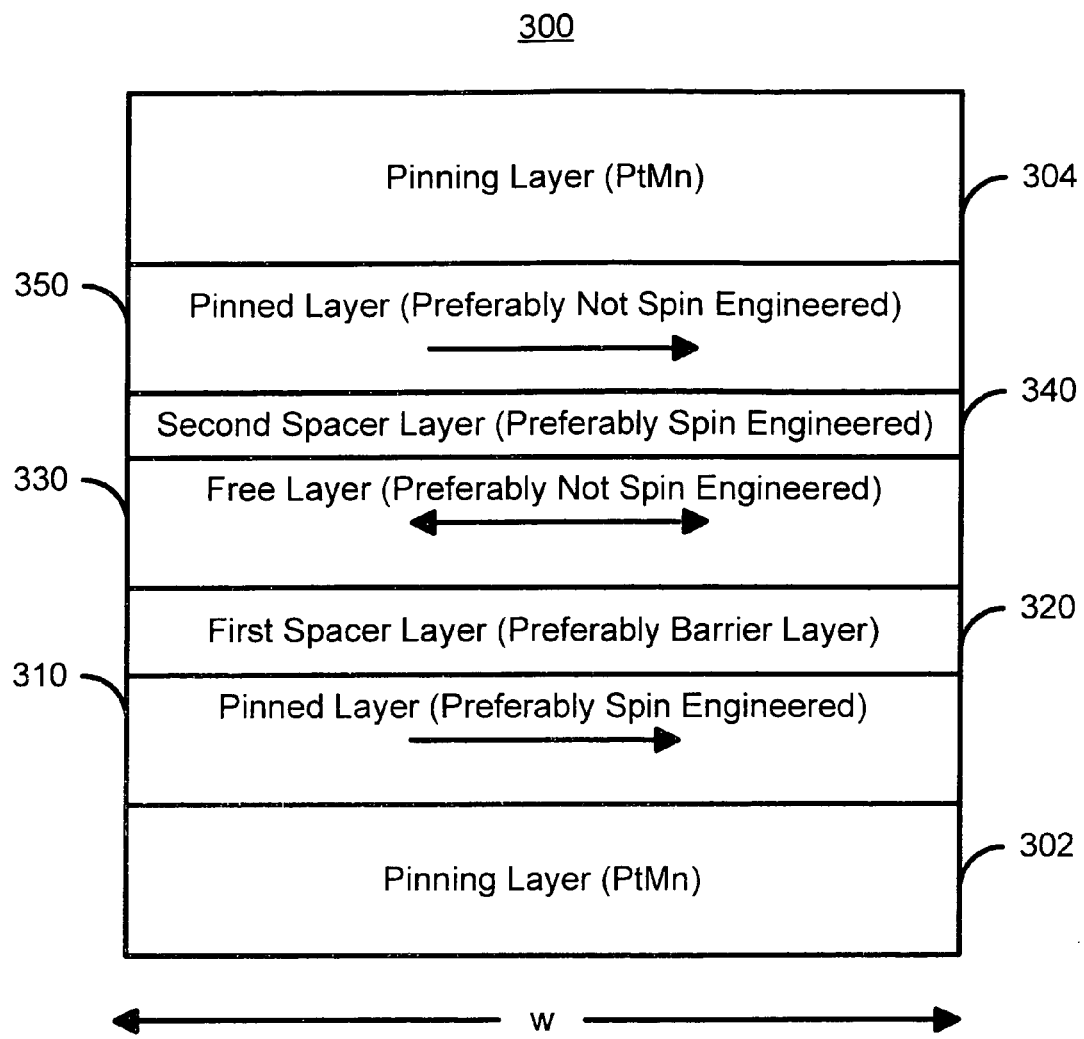
FIG. 10 is a second preferred embodiment of a magnetic element in accordance with the present invention utilizing spin engineering.

FIG. 10 is a second preferred embodiment of a magnetic element 300 in accordance with the present invention utilizing spin engineering. Portions of the magnetic element 300 are analogous to portions of the magnetic element 100 and are, therefore, labeled similarly. Consequently, the magnetic element 300 includes a first pinned layer 310, a first spacer layer 320, and a free layer 330. The magnetic element 300 also includes a second spacer layer 340 and a second pinned layer 350. Also depicted are pinning layers 302 and 304 that are preferably AFM layers. However, no separate spin engineered layer 140 is depicted. This is because at least one of the remaining layers is spin engineered. Preferably at least one of the first pinned layer 310 and the second spacer layer 340 is spin engineered. Consequently, at least one of the first pinned layer 310 and the second spacer layer 340 includes an internal spin engineered layer. In a preferred embodiment, the spacer layer 320 is a barrier layer, for example composed of alumina, that allows tunneling of electrons between the first pinned layer 310 and the free layer 330. Also in a preferred embodiment, the first pinned layer 310 and the second spacer layer 340 are spin engineered. However, in an alternate embodiment both the first pinned layer 310 and the second spacer layer 340 need not be spin engineered. In addition, the magnetic element 300 generally also includes seed layers (not shown) and capping layers (not shown). Furthermore, the magnetic element 300 is configured such that the free layer 330 can be written using spin transfer. In a preferred embodiment, the lateral dimensions, such as the width w, of the free layer 330 are thus small and preferably less than two hundred nanometers. In addition, some difference is preferably provided between the lateral dimensions to ensure that the free layer 330 has a particular easy axis of magnetization. Thus, the lateral dimensions of the free layer 330 are preferably substantially the same as discussed above for the free layer 330.

The first pinned layer 310 is preferably spin engineered. Thus, the first pinned layer 310 includes an internal spin engineered layer (not separately depicted in FIG. 10). The spin engineered pinned layer 310 thus preferably has a structure that is the same as the spin engineered pinned layers 210', 210'', and 210''' depicted in FIGS. 7, 8, and 9 respectively. The first spacer layer 320 is preferably a barrier layer, which provides a higher resistance for the magnetic element 300. The free layer 330 is preferably not spin engineered. Consequently, the free layer 330 preferably has a structure that is analogous to the free layer 130, depicted in FIG. 2.

Figure 11:
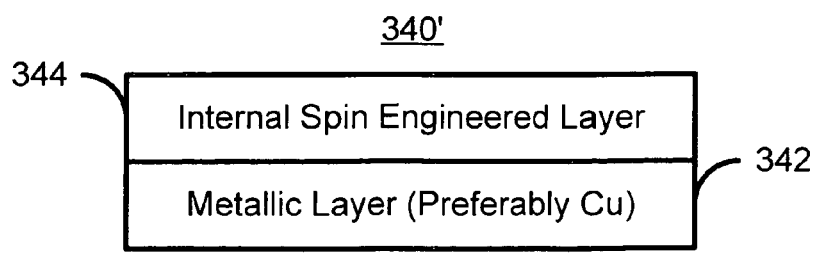
FIG. 11 depicts a first embodiment of a spin engineered spacer layer in accordance with the present invention.
Figure 12:
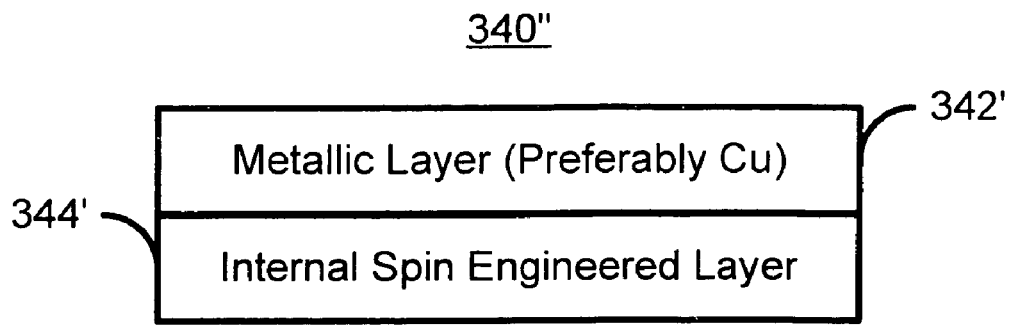
FIG. 12 depicts a second embodiment of a spin engineered spacer layer in accordance with the present invention.
Figure 13:
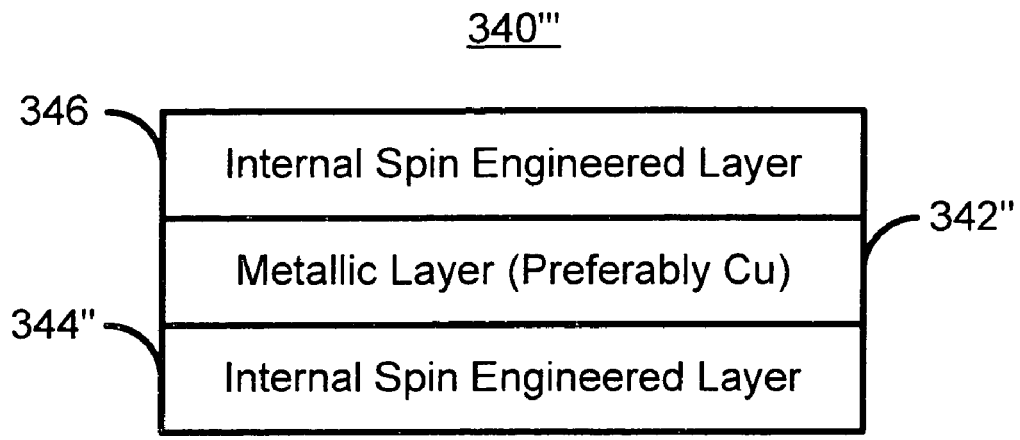
FIG. 13 depicts a third embodiment of a spin engineered spacer layer in accordance with the present invention.
Figure 14:
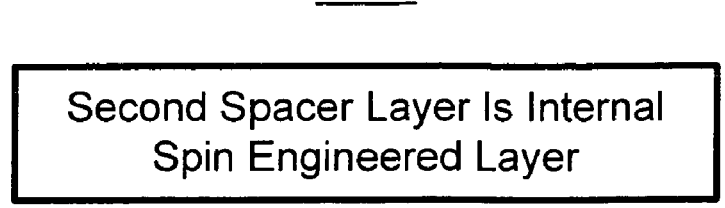
FIG. 14 depicts a fourth embodiment of a spin engineered spacer layer in accordance with the present invention.

Referring back to FIG. 10, the second spacer layer 340 is preferably spin engineered. FIGS. 11-14 depict embodiments of a spin engineered spacer layer 340 in accordance with the present invention. Referring to FIGS. 10-14, if the second spacer layer 340 is spin engineered, then the second spacer layer 340 includes at least one internal spin engineered layer. Thus, a first embodiment of a spin engineered spacer layer 340' in accordance with the present invention is depicted in FIG. 11. The spin engineered spacer layer 340' includes a metallic layer 342 that is preferably Cu and an internal spin engineered layer 344. The Cu layer 342 resides between the free layer 330 and the internal spin engineered layer 344. FIG. 12 depicts a second embodiment of a spin engineered spacer layer 340'' in accordance with the present invention. The spin engineered spacer layer 340'' includes an internal spin engineered layer 344' and a metallic layer 342' that is preferably Cu. The internal spin engineered layer 344' resides between the free layer 330 and the metallic layer 342'. FIG. 13 depicts a third embodiment of a spin engineered spacer layer 340''' in accordance with the present invention. The spin engineered spacer layer 340''' includes a first internal spin engineered layer 344'', a metallic layer 342'' that is preferably Cu, and a second internal spin engineered layer 346. The metallic layer 342'' is between the first and second internal spin engineered layers 344'' and 346. In addition, the first internal spin engineered layer 344'' preferably resides between the free layer 330 and the metallic layer 342''. The internal spin engineered layers 344, 344', 344", and 346 preferably include Ru or Co(Fe)Ru. FIG. 14 depicts a fourth embodiment of a spin engineered spacer layer 340"" in accordance with the present invention. The spin engineered spacer layer 340"" can be considered to consist of an internal spin engineered spacer layer and, therefore, includes Ru or RuX, where X is Ru, Os, Ir, Re, Mn, Cr, Mo, and W.

The internal spin engineered layers 344, 344', 344", and/or 346 and the spin engineered spacer layer 340"" function in an analogous manner to the spin engineered layer 140 depicted in FIG. 2. Referring back to FIGS. 10-14, when current is driven downwards (electrons traveling upwards) in FIGS. 10-14, the internal spin engineered layers 344, 344', 344", and/or 346 and the spin engineered spacer layer 340"" tend to reflect majority electrons back to the free layer 330. As a result, spin transfer is enhanced. When current is driven upwards (electrons traveling downwards), majority electrons are more strongly scattered by the internal spin engineered layers 344, 344', 344", and/or 346 and the spin engineered spacer layer 340"". Consequently, minority electrons are more likely to pass through the free layer 330, reflect back from the pinned layer 310, and transfer their angular momentum to the free layer 330, respectively. Consequently, spin transfer is enhanced in both cases and the write current used can be reduced.

Because the magnetic element 300 may include spin engineered layers, such as spin engineered pinned layer 310 and spin engineered spacer layer 340, 340', 340", 340'" and/or 340"", spin transfer is enhanced and the write current required to write to the magnetic element 300 is reduced. Consequently, the magnetic element 300 would share the benefits of the magnetic elements 100 and 200. Furthermore, because two pinned layers 310 and 350 are used, spin transfer is further enhanced. Thus, an even lower write current might be used. As a result, the magnetic element 300 may be even more suitable for use in higher density MRAM.

Figure 15:
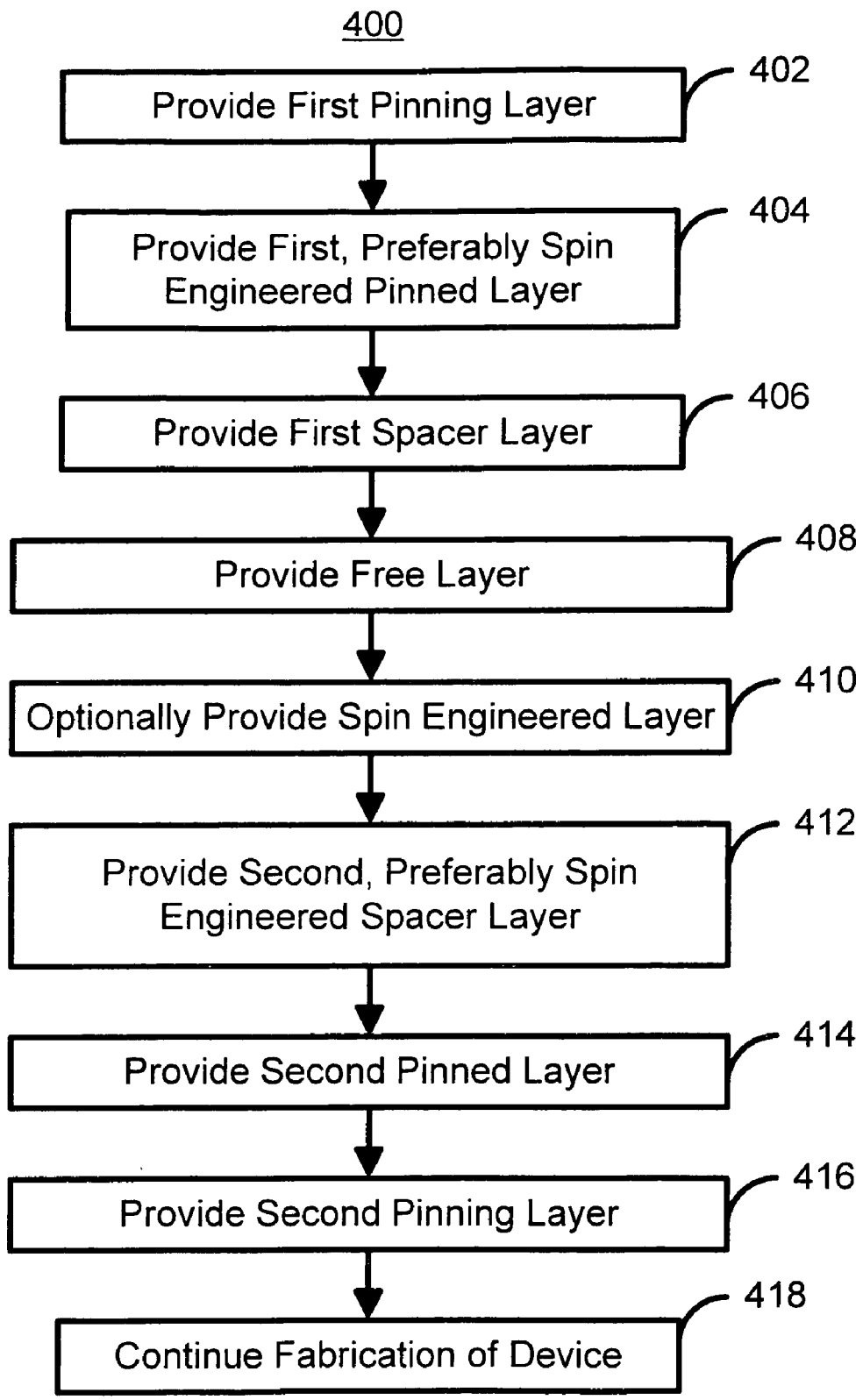
FIG. 15 is a high-level flow chart depicting one embodiment of a method in accordance with the present invention for fabricating a magnetic element in accordance with the present invention utilizing spin engineering.

FIG. 15 is a high-level flow chart depicting one embodiment of a method in accordance with the present invention for fabricating a magnetic element in accordance with the present invention utilizing spin engineering. For clarity, the method 400 is described in the context of the magnetic element 300. However, the method 400 could be used for other magnetic elements, such as the magnetic element 100 and 200. However, some steps would be omitted. Moreover, although the method 400 is described primarily in the context of a single magnetic element, one of ordinary skill in the art will readily recognize that multiple magnetic elements may be fabricated substantially simultaneously. The first pinning layer 302 is provided, via step 402. The first pinned layer 310 is provided, via step 404. In one embodiment, step 404 includes providing a spin engineered pinned layer, such as the pinned layers 210, 210', 210", and 210'". The first spacer layer 320 is provided, via step 406. The first spacer layer 320 is preferably insulating. The free layer 330 is provided, via step 408. Step 408 may thus include providing a spin engineered free layer, particularly if the magnetic element 200 is being provided. Thus, step 408 might include providing the spin engineered free layers 230, 230', or 230". A spin engineered layer, such as the layer 140, is optionally provided, via step 410. However, if the magnetic elements 200 or 300 are being provided, then step 410 is omitted. If the magnetic elements 100 or 200 are being provided, then the method 400 terminates. However, if the magnetic element 300 is provided, then the second spacer layer 440 is provided, via step 412. Step 412 preferably includes providing a spin engineered spacer layer such as the layers 340', 340", 340'" and/or 340"". The second pinned layer 350 is provided, via step 414. The second pinning layer 304 is provided, via step 416. Formation of the magnetic memory may be continued, via step 418. Thus, using the method 400, or a portion thereof, the magnetic elements 100, 200 and/or 300 can be fabricated. Thus, magnetic elements having a lower spin transfer based switching current can be fabricated.

A method and system for providing a magnetic element that is more thermally stable and capable of being written using a lower current density have been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic element comprising:
   a pinned layer;
   a spacer layer, the spacer layer being nonmagnetic;
   a free layer, the spacer layer residing between the pinned layer and the free layer;
   wherein at least one of the pinned layer, the spacer layer, and the free layer includes an internal spin engineered layer configured to more strongly scatter majority electrons than minority electrons, the internal spin engineered layer including at least one of a metal layer, RuX, and CoFeY, wherein X includes at least one of Os, Ir, Rh, Re, Mn, Cr, and V, Y includes at least one of Ru, Os, Ir, Rh, Re, Mn, Cr, and V and wherein the metal layer includes at least one of Os, Ir, Re, Mn, Mo, and W;
   wherein the magnetic element is configured to allow the free layer to be switched due to spin transfer when a write current is passed through the magnetic element;
   wherein the free layer includes the internal spin engineered layer and a ferromagnetic layer separate from the internal spin engineered layer; and
   wherein the internal spin engineered layer consists of Co(Fe)Ru.

* * * * *